United States Patent [19]

Hornbeck

[11] Patent Number: 4,662,746

[45] Date of Patent: May 5, 1987

[54] SPATIAL LIGHT MODULATOR AND METHOD

[75] Inventor: Larry J. Hornbeck, Van Alstyne, Tex.

[73] Assignee: Texas Instruments Incorporated, Dallas, Tex.

[21] Appl. No.: 792,947

[22] Filed: Oct. 30, 1985

[51] Int. Cl.$^4$ .................. G02B 26/02; G02B 00/00; H01S 3/00

[52] U.S. Cl. .................. 350/269; 332/7.51; 350/320

[58] Field of Search ............. 350/632, 360, 487, 486, 350/6.6, 269

[56] References Cited

U.S. PATENT DOCUMENTS

| | | | |
|---|---|---|---|
| 3,600,798 | 8/1971 | Lee | 350/320 |
| 3,886,310 | 5/1975 | Guldberg et al. | 350/360 |
| 3,896,338 | 7/1975 | Nathanson et al. | 358/60 |
| 4,229,732 | 10/1980 | Hartstein et al. | 358/233 |
| 4,566,935 | 1/1986 | Hornbeck | 350/360 |
| 4,596,992 | 6/1986 | Hornbeck | 350/360 |

Primary Examiner—John K. Corbin
Assistant Examiner—Vincent J. Lemmo
Attorney, Agent, or Firm—Carlton H. Hoel; Leo N. Heiting; Melvin Sharp

[57] ABSTRACT

An electrostatically deflectable beam spatial light modulator with the beam composed of two layers of aluminum alloy and the hinge connecting the beam to the remainder of the alloy formed in only one of the two layers; this provides a thick stiff beam and a thin compliant hinge. The alloy is on a spacer made of photoresist which in turn is on a semiconductor substrate. The substrate contains addressing circuitry in a preferred embodiment.

18 Claims, 23 Drawing Figures

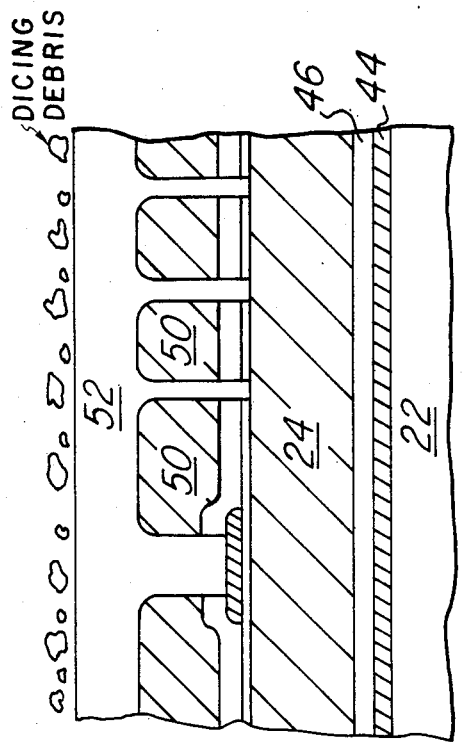
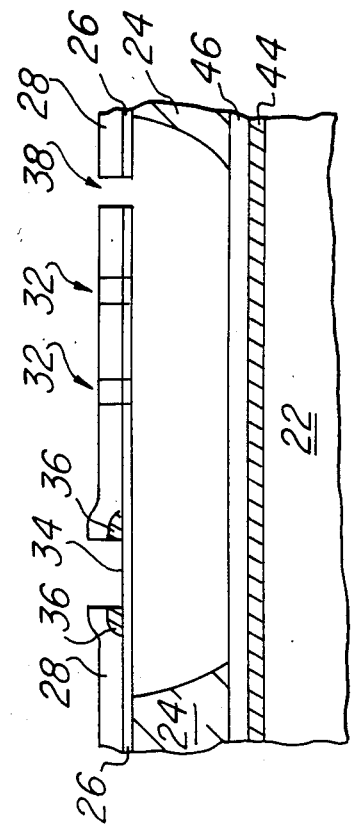
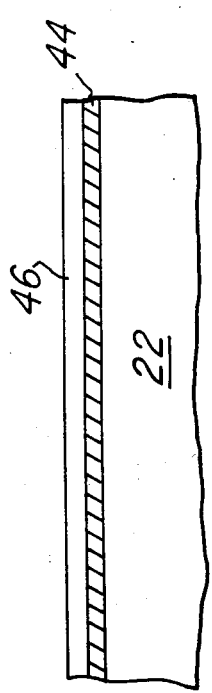
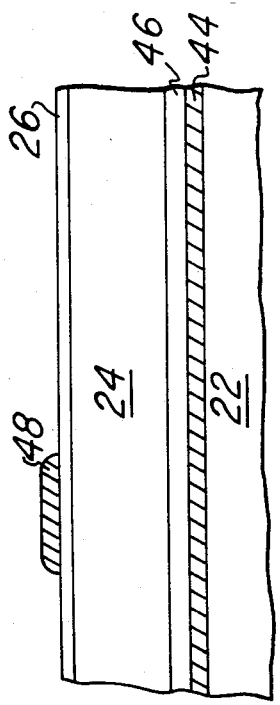
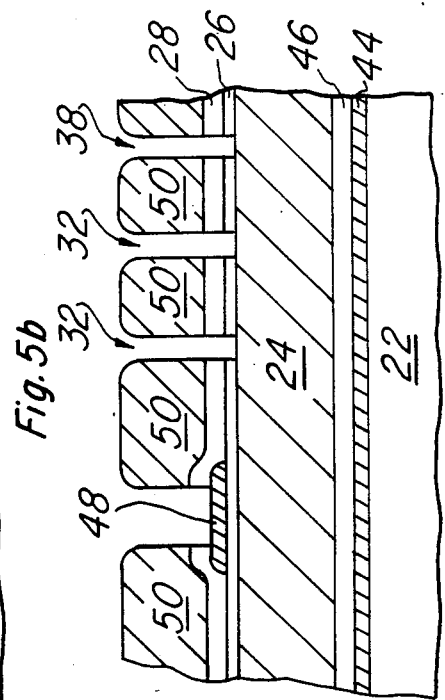

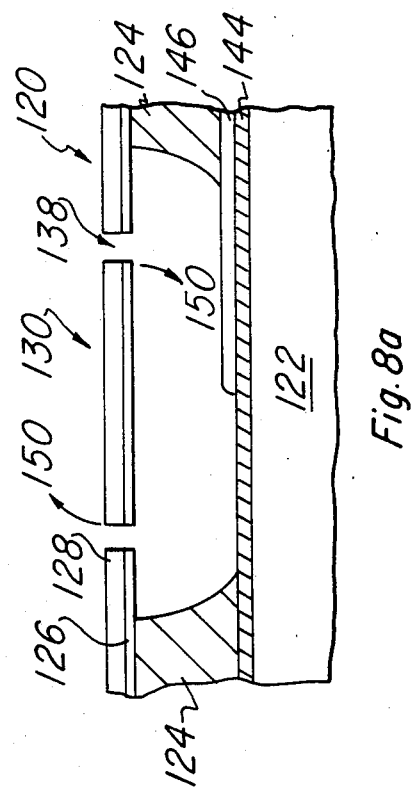
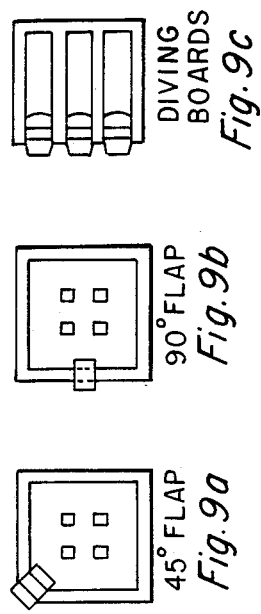
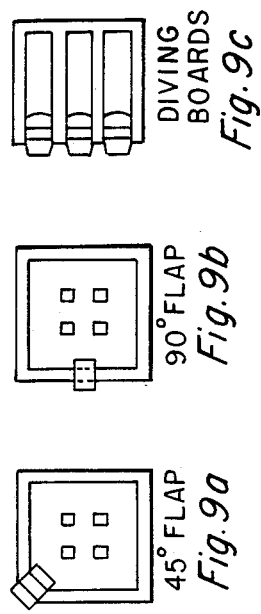
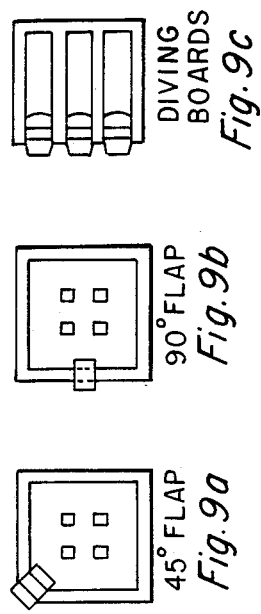
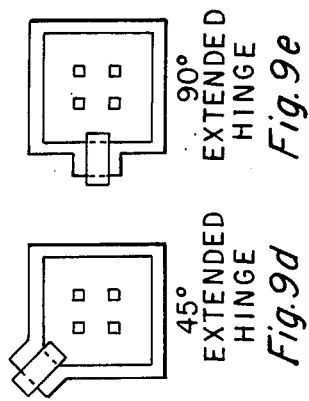
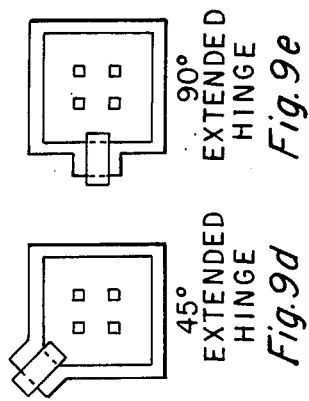
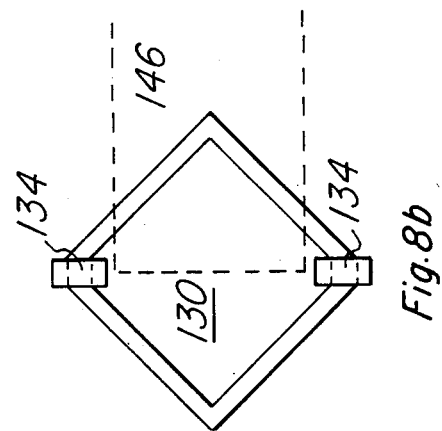

SPATIAL LIGHT MODULATOR AND METHOD

RELATED APPLICATIONS

This application is related to applicant's following copending applications: U.S. Ser. No. 635,967 filed July 31, 1984; U.S. Ser. No. 636,180 filed July 31, 1984; and U.S. Ser. No. 646,399 filed Aug. 31, 1984.

BACKGROUND OF THE INVENTION

The present invention relates to spatial light modulators (light valves), and, more particularly, to spatial light modulators with pixels formed of electronically addressable deflectable beams.

Spatial light modulators (SLM) are transducers that modulate incident light in a spatial pattern corresponding to an electrical or optical input. The incident light may be modulated in its phase, intensity, polarization, or direction, and the light modulation may achieved by a variety of materials exhibiting various electrooptic or magnetoopotic effects and by materials that modulate light by surface deformation. SLMs have found numerous applications in the areas of optical information processing, projection displays, and electrostatic printing. See references cited in L. Hornbeck, 128 X 128 Deformable Mirror Device, 30 IEEE Tran.Elec.Dev. 539 (1983).

A well known SLM used for large bright electronic displays is the Eidophor, a system which uses an electrostatically dimpled oil film as the active optical element. See. E. Baumann. The Fischer large-screen projection system (Eidophor). 20 J.SMPTE 351 (1953). In this system a continuous oil film is scanned in raster fashion with an electron beam that is modulated so as to create a spatially periodic distribution of deposited charge within each resolvable pixel area on the oil film. This charge distribution results in the creation of a phase grating within each pixel by virtue of the electrostatic attraction between the oil film surface and the supporting substrate, which is maintained at constant potential. This attractive force causes the surface of the film to deform by an amount porportional to the qunatity of deposited charge. The modulated oil film is illuminatd with spatially coherent light from a xenon arc lamp. Light incident to modulated pixels on the oil film is diffracted by the local phase gratings into a discrete set of regularly spaced orders which are made to fall on a schlieren stop consisting of a periodic array of alternating clear and opaque bars by part of the optical system. The spacing of the schlieren stop bars is chosen to match the spacing of the diffracted signal orders at the stop plane so that high optical throughput efficiency is achieved. Light that is incident to unmodulated regions of the light valve is blocked from reaching the projection lens by the opaque bars of the schlieren stop. Images formed of unmodulated areas on the light valve by the schlieren imaging system on the projection screen are therefore dark, while the phase perturbations introduced by the molulated electron beams are converted into bright spots of light at the screen by the schlieren projector. In spite of numerous technical difficulties associated with oil polymerization by electron bombardment and organic vapor contamination of the cathode, this type of oil-film system has been successfully developed to the point that it is the almost universally used system for a total light requirement of thousands of lumens at the screen. However, such systems are expensive, bulky, and have short-lived components.

A number of non-oil-film SLMs have also been developed and include deflectable element types, rotation of plane of polarization types, and light scattering types. These SLM types employ various effects such as deformation of reflective layers of metal, elastomer, or elastomer-photoconductor, and polarization and scattering of ferroelectrics, PLZT ceramics, and liquid crystals. For example, R. Sprague et al. Linear total internal reflection spatial light modulator for laser printing. 299 Proc. SPIE 68 (1981) and W. Turner and R. Sprague, Integrated total internal reflection (TIR) spatial light modulator for laser printing, 299 Proc. SPIE 76 (1982) and U.S. Pat. No. 4,380,373 describe a system for non-impact printing on a photosensitive medium in which laser light is formed into a line of illumination and passed through a linear array of light modulators and then imaged onto the photosensitive medium. The array is implemented as a total internal reflection spatial light modulator with the electrodes and drive electronics fabricated on an integrated drive element which is placed against the total reflection surface of an electrooptic crystal such as lithium niobate. The localized change in index of refraction produced by the fringing field between each two electrodes is read out with schlieren readout optics which image the TIR interface onto the photosensitive medium. This is a one dimensional image, and the photosensitive medium is rotated on a drum beneath the image of the linear array to generate the two dimensional image (e.g., a page of text) for printing applications. However, the SLM (light valve) is highly susceptible to fabrication problems due to its hybrid nature. The fringing field strength, and hence the amount of light diffracted from modulated pixels, is sensitive to changes in the air gap thickness between the address electrodes and the electrooptic crystal surface of less than one tenth micron. Thus, even very small particles trapped between the crystal and electrode structure could cause illumination nonuniformity problems at the photosensitive medium. The system optical response for pixels located at the boundary between modulated and unmodulated areas of the light valve is also significantly lower than the response for pixels near the middle of a modulated region due to the nature of the addressing technique. A commercially available printer based on this technology has not been introduced to date.

M. Little et al., CCD-Addressed Liquid Crystal Light Valve. Proc. SID Symp. 250 (April 1982) describes a SLM with a CCD area array on the front side of a silicon chip and a liquid crystal array on the backside of the chip. Charge is input into the CCD until a complete frame of analog charge data has been loaded: the charge is then dumped to the backside of the chip where it modulates the liquid crystal. This device suffers from severe fixed pattern noise as well as resolution degradation due to the charge spreading from the front-to-back transfer.

Another SLM type which may be fabricated in both one and two dimensional arrays is the deformable mirror. Deformable mirrors may be subdivided into three classes: elastomers, membranes, and cantilever beams. In the elastomer approach a metallized elastomer is addressed by a spatially varying voltage that produces surface deformation through compression of the elastomer. Because of the address voltage requirements in the order of one or two hundred volts, the elastomer is not a good candidate for integration with a high-density silicon address circuit. See, generally, A. Lakatos and R. Bergen, TV projection display using an amorphorous-Se-type RUTICON light valve, 24 IEEE Tran.Elec.Dev. 930 (1977).

Membrane deformable mirrors come in a variety of types. One type is essentially a substitute for the oil film of the Eidophor system discussed above. In this system a thin reflective membrane is mounted to the faceplate of a cathode ray tube (CRT) by means of a support grid structure. Addressing is by a raster scanned electron beam as with the Eidophor. The charge deposited on the glass faceplate of the CRT by the electron beam electrostatically attracts the membrane which is held at a constant volatge. This attractive force causes the memebrane to sag into the well formed by the grid structure, thereby forming a miniature spherical mirror at each modulated pixel location. The light diffracted from this type of modulated pixel is concentrated into a relatively narrow cone that is rotationally symmetric about the specularly reflected beam. This type of light valve is thus used with a schlieren stop that consists of a single central obsucration positioned and sized so as to block the image of the light source that is formed by the optical system after specular reflection from unmodulated areas of the light valve. Modulated pixels give rise to a circular patch of light at the schlieren stop plane that is larger than the central obscuration, but centered on it. The stop efficency, or fraction of the modulated pixel energy that clears the schlieren stop, is generally somewhat lower for projectors based on deformable membranes than it is for the oil film Eidophor projector. Further, such membrane deformable mirror systems have at least two major problems. High voltages are required for addressing the relatively stiff reflective membrane, and slight misalignments between the eletron beam raster and the pixel support grid structure lead to addressing problems. Such misalignments would cause image blurring and nonuniformity in display brightness.

Another type of membrane deformable mirror is described in L. Hornbeck, 30 IEEE Tran.Elec.Dev.539 (1983) and U.S. Pat. No. 4,441,791 and is a hybrid integrated circuit consisting of an array of metallized polymer mirrors bonded to a silicon address circuit. The underlying analog address circuit, which is separated by an air gap from the mirror elements, causes the array of mirrors to be displaced in selected pixels by electrostatic attraction. The resultant two-dimensional displacement pattern yields a corresponding phase modulation pattern for reflected light. This pattern may be converted into analog intensity variations by schlieren projection techniques or used as the input transducer for an optical information processor. However, the membrane deformable mirror has manufacturability problems due to the susceptibility to defects that result when even small, micron sized paticles are trapped between the membrane and the underlyiong support structure. The membrane would form a tent over these trapped particles, and the lateral extent of such tents is much larger than the size of the particle itself, and these tents would in turn be imaged as bright spots by a schlieren imaging system.

A cantilever beam deformable mirror is a micromechanical array of deformable cantilever beams which can be electrostatically and individually deformed by some address means to modulate incident light in a linear or areal pattern. Used in conjunction with the proper projection optics, a cantilever beam deformable mirror can be employed for displays, optical information processing, and electrophotographic printing. An early version with metal cantilever beams fabricated on glass by vacuum evaporation appears in U.S. Pat. No. 3,600,798. This device has fabrication problems which include the alignment of the front and back glass substrates arising from the device's nonintegrated architecture.

A cantilever beam deformable mirror device is described in R. Thomas et al. The Mirror-Matrix Tube: A Novel Light Valve for Projection Displays, 22 IEEE Tran.Elec.Dev. 765 (1975) and U.S. Pat. Nos. 3,886,310 and 3,896,338. This device is fabricated as follows: a thermal silicon dioxide layer is grown on a silicon on sapphire substrate: the oxide is patterned in a cloverleaf array of four cantilever beams joined in the middle. The silicon is isotropically wet etched until the oxide is undercut, leaving within each pixel four oxide cantilever beams supported by a central silicon support post. The cloverleaf array is then metallized with aluminum for reflectivity. The aluminum which is deposited on the sapphire substrate forms a reference grid electrode which is held at a DC bias. The device is addressed by a scanning electron beam which deposits a charge pattern on the cloverleaf beams causing the beams to be deformed by electrostatic attraction towards the reference grid. Erasure is achieved by negatively biasing a closely spaced external grid and flooding the device with low-energy electrons. A schlieren projector is used to convert the beam deformation into brightness variations at the projection screen. A significant feature of this device is the cloverleaf geometry which leads to beam deflection in a direction rotated forty-five degrees from the openings between the beams; this permits use of a simple cross shaped schlieren stop to block out the fixed diffraction background signal without attenuating the modulated diffraction signal. The device was fabricated with a pixel density of five hundred pixels per inch with beams deflectable up to four degrees. The optics employed a 150 watt xenon arc lamp, reflective schlieren optics and a 2.5 by 3.5 foot screen with a gain of five. Four hundred TV lines of resolution were demonstrated with a screen brightness of thirty-five foot-lumens, a contrast ratio of fifteen to one, and a beam diffraction efficiency of forty-eight percent. Write times of less than 1/30 second were achieved and erase times were as short as 1/10 of the write time. However, the device has problems, including degradation of resolution from scanning errors, poor manufacturing yield, and no advantage over conventional projection cathode ray tubes. That is, the scan-to-scan positioning accuracy is not high enough to reproducibly write on individual pixels. The resultinig loss of resolution forces at least a four fold increase in the number of pixels required to maintain the same resolution compared to comparably written phosphor. Also, the device yield is limited by the lack of an etch stop for the cloverleaf support post, the wet etching of the beams leading to beam breakage, and the need to evaporate normally tensile aluminum in a state of zero stress on the oxide beams. Further, the device offers no apparent cost or performance advantage over conventional projection CRTs.

Cantilever beam deformable mirrors integrated on silicon with addressing circuitry, thus eliminating the electron beam addressing with its high voltage circuitry and vacuum envelopes of the previously described cantilever device, appear in K. Petersen, Micromechanical Light Modulator Array Fabricated on Silicon, 31 Appl.Phy.Lett. 521 (1977) and U.S. Pat. No. 4,229,732. The first of these references describes a 16 by 1 array of diving board-shaped cantilever beams fabricated as follows: an epitaxial layer of (100)-oriented silicon (either p or n) of thickness of about 12 microns is grown on a p+ substrate (or buried layer); the epilayer is oxidized to a thickness of about 0.5 micron and covered with a Cr-Au film of thickness about 500 Å. The Cr-Au is etched away to form contact pads and address lines and to define the diving board metallization. The oxide is etched away in a comb pattern around the metallization in a second masking step. Finally, the silicon itself is etched in a solution of ethylenediamine and pyrocatechol at 120 degrees C. If the proper orientation of the mask with respect to the crystalline axes is maintained, the metal-coated oxide diving boards will be undercut by the etch and freed from the silicon. Since the etch is anisotropic, further lateral etching will be stopped by the (111) planes defining the rectangular envelope of the comb pattern. In addition, the etchant is inhibited by p+ material, so the depth of the well beneath the diving boards is defined by the thickness of the epilayer. When a dc voltage is applied between the substrate and the diving board metallization, the thin oxide diving board will be electrostatically deflected downward into the etched well. Diving boards of length 106 microns and width 25 microns showed a threshold voltage of about 66 volts.

The second reference (U.S. Pat. No. 4,229,732) describes devices fabricated in a manner similar to the diving board device (a buried p+ layer as an etch stop for forming the wells underneath metallized silicon dioxide cantilever beams) but has a different architecture; namely, the cantilever beams are in the shape of square flaps hinged at one corner, the flaps form a two dimensional array instead of the one dimensional row of diving boards, and the wells underneath the flaps are not connected so that addressing lines for the flaps may be formed on the top surface of the silicon between the rows and columns of flaps. Of course, the corner hinging of the flaps derives from the cloverleaf architecture of U.S. Pat. Nos. 3,886,310 and 3,896,338, but the full cloverleaf architecture could not be used because this would preclude the surface addressing lines since cloverleaf flaps are hinged to a central post isolated from the silicon surface. Further, these devices have problems including poor resolution and low efficiency due to density limitations and the small fractional active area, low manufacturing yield, degradation of contrast ratio due to diffraction effects from the address circuitry, and residual image due to the charging effects of the oxide flap. More particulary, the addressing circuitry is squeezed around the active area (flaps) because no option exists for placing the address circuitry under the active area due to the wells being formed by etching away the epilayer down to the p+ etch stop. Thus the active area is reduced substantially together with the diffraction efficiency. This means more lamp power is required for the same screen brightness. Because the address circuitry requires additional area, the pixel size is increased far beyond the flap area with a resulting decrease in achievable resolution. The wet etching required to form the wells leads to low electrical and mechanical yield: indeed, wet cleanups, such as after dicing into chips, destroy flaps and diving boards because during the spin-rinse/dry cycle the water trapped under the beam breaks the beam as it is spun from the surface. If the water is instead evaporated from the surface it leaves behind surface residues which can increase surface leakage currents contributing to erratic device operation. Also, the addressing circuitry being on the silicon surface is exposed to the incident light to be modulated and creates unwanted diffraction effects from the transistor gates plus lowers the contrast ratio. In addition, light leakage into the address structure produces photogenerated charge and reduces storage time. Lastly, the oxide metal flap has the insulating side facing the well and will charge up due to the intense electric fields which exist across the well; this produces a residual (burn-in) image. The AC drive required to eliminate this residual image problem cannot be supplied by the NMOS drive circuitry described. Further, if the flap is deflected past the maximum stable deflection, then it will collapse and stick to the bottom of the well. Thus, voltages over the collapse voltage must be absolutely avoided.

A variation of the cantilever beam approach appears in K. Petersen. Silicon Torsional Scanning Mirror. 24 IBM J.Res.Devp. 631 (1980) and M. Cadman et al. New Micromechanical Display Using Thin Metallic Films. 4 IEEE Elec.Dev.Lett. 3 (1983). This approach forms metallic flaps which are connected to the surrounding reflective surface at two opposed corners and operate by twisting the flaps along the axes formed by the connections. The flaps are not formed monolithically with the underlying addressing substrate, but are glued to it in a manner analogous to the deformable membrane devices mentioned above.

The cantilever beam references discussed above all suggest that schlieren projection optical systems be used with the cantilever beam devices. But such systems have limitations in terms of attainable optical performance. First, the aperture diameter of the imaging lens must be larger than is necessary to pass the signal energy alone. Hence the speed of the lens must be relatively high (or, equivalently, its f-number must be relatively low) to pass all the signal energy around the central schlieren stop obscuration. In addition, the signal passes through the outer portion of the lens pupil in this imaging configuration. Rays of light emanating from any given point on the SLM and passing through the outermost areas of an imager lens pupil are the most difficult ones to bring to a well-corrected focus during the optical design of any imaging lens. When the outer rays are brought under good control, the rays passing through the center of the imager lens are automatically well-corrected. Hence, a greater level of optical design complexity is required of the imaging lens. Second, the field angle over which the imaging lens can form well-corrected images of an off-axis pixels on a cantilever beam SLM is also restricted. Any lens design task involves a compromise between the speed of the lens and the field angle it can cover with good image quality. Fast lenses tend to work over small fields, while wide angle lenses tend to be relatively slow. Since the schlieren imager must be well-corrected over its entire aperture, and since the aperture is larger in diameter than is required to pass the image forming light, the field angle that can be covered by the lens is smaller than it could be if a different imaging configuration could be devised in which the signal was passed through the center of an unobscured, smaller diameter lens. Lastly, for an imager lens having a given finite speed, the use of the schlieren stop configuration also limits the size of the light source that can be utilized. This in turn limits the irradiance level that can be delivered to a projection screen or a photoreceptor at the image of a deflected pixel. This irradiance level, or the delivered power per unit area, depends on the product of the radiance of the light source, the transmittance of the optical system, and the solid angle of the cone of image forming rays of light. The source radiance is determined only by the particular lamp that is used. The optics transmittance depends on the stop efficiency for the particular SLM/schlieren stop configuration and surface transmission losses. But the solid angle of the image forming cone of light is directly proportional to the area of the imager lens pupil that is filled with signal energy. The use of a schlieren stop that obscures the central area of the imager lens pupil limits the usable pupil area and thus the image plane irradiance level that can be obtained for a lens of a given speed and a source of a given radiance; this is in addition to the fundamental irradiance limitation that the maximum usable cone of light has an opening angle equal to the beam deflection angle.

Thus the known cantilever beam SLMs have problems including addressing circuitry limiting the fractional active area of the pixels, processing steps giving low yields, sensitivity to film stress in the beams, beam insulator charging effects, lack of overvoltage protection against beam collapse, performance not compatible with low cost optics design, and low contrast ratio due to non planarized addressing circuitry on the surface.

SUMMARY OF THE INVENTION

The present invention provides deflectable beam spatial light modulators with pixels in the preferred embodiments including a spacer layer between a substrate and a reflective layer incorporating the deflectable hinged beams in which the spacer layer is a material that can be spun onto or conformally deposited on the substrate to cover any addressing circuitry, the beam is two layers of metal for stiffness but only one of the layers forms the hinge for compliance, and the pixel addressing may be in the substrate or in the reflective layer. The beam geometry may be square (hinged at the corner or the side), diving boards, offset rectangular, or square torsion hinged. And the addressing may be configured to load only a portion of a beam.

The problems of the known deflectable beam spatial light modulators are solved by substrate addressing which maximizes the active area of the pixels and avoids low contrast due to nonplanar surfaces. The spacer material permits high yield processing and low stress beams. Metal beams avoid static charging and can provide overvoltage protection, and the two layer beam is stiff to avoid surface stress warping but the one layer hinge provides high compliance and sensitivity.

BRIEF DESCRIPTION OF THE DRAWINGS

FIGS. 5a-5e illustrate in cross setnal view the steps of the first preferred embodiment method of fabrication;

FIGS. 8a and 8b illustrates in cross sectional and plan views a third preferred embodiment; and FIGS. 9a-9e show alternative beam geometries.

DESCRIPTION OF THE PREFERRED EMBODIMENTS

The inventive deflectable beam spatial light modulators (SLM) are typically formed of linear or area arrays of pixels, each pixel individually addressable and containing at least one deflectable reflecting cantilever beam: the pixels are organized in the form of monlithic silicon based chips. The chips are fabricated by processing silicon wafers, dicing the wafers into chips, followed by processing of the individual chips. The chips will vary in size depending uon the application: for example, a 2400 by 1 linear array of pixels (which could be a component of a 300 dots per inch printer) may be fabricated on a chip about 1300 mils by 250 mils with pixels about 12 microns square. The SLMs operate by reflecting light off of the pixels, and the reflected light is modulated by varying the deflection of the deflectable beams. Such SLMs are consequently also called deformable mirror devices (DMD) and the deflectable beams are called mirror elements. The following descriptions are primarily of the individual pixels for a DMD, and all of the drawings are schematic for clarity of explanation. Applicant's copending application Ser. No. 636,180 (hereby incorporated by reference together with applicant's other related applications) also discloses DMD pixels, but such pixels have problems of sensitivity to process induced surface stress, and the trade off between electromechanical compliance (which translates to sensitivity) and flatness of the mirror elements is unsatisfactory. The preferred embodiments described in the following overcome such problems.

Figure 1A:
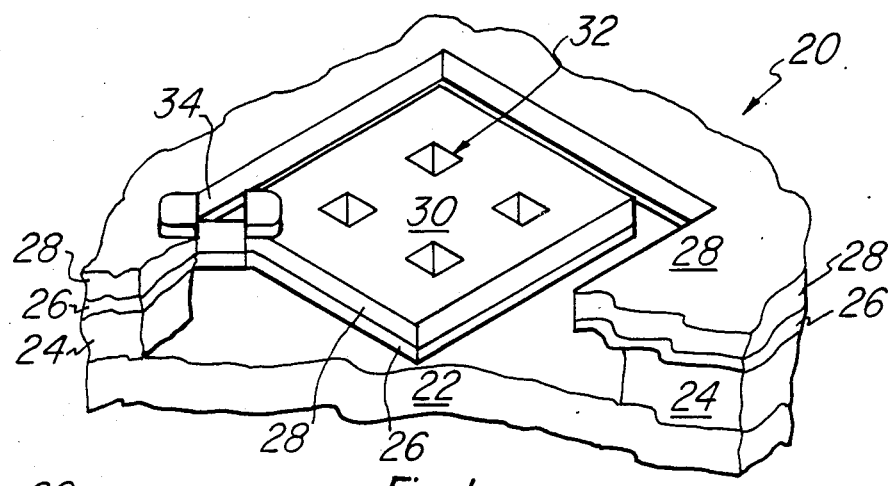
FIGS. 1a-1c illustrate in perspective, cross sectional elevation, and plan views a first preferred embodiment pixel.
Figure 1B:
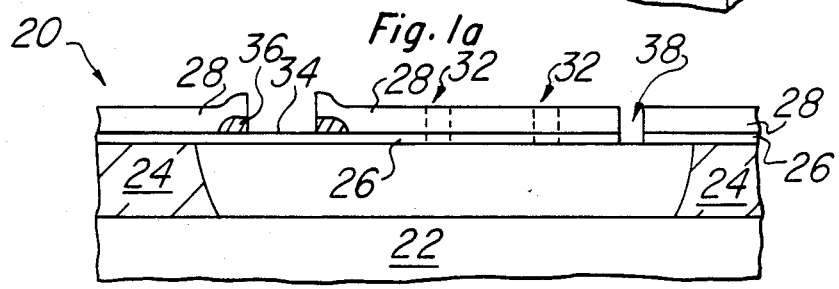
Figure 1C:
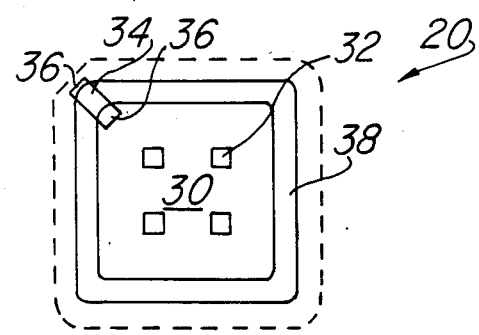

A first preferred embodiment single pixel of a DMD fabricated by a first preferred embodiment method is illustrated in perspective view in s FIG. 1a, in cross sectional elevation in FIG. 1b, and in plan view in FIG. 1c. The pixel, generally denoted 20, is basically a flap covering a shallow well and includes silicon substrate 22, spacer 24, hinge layer 26, beam layer 28, flap 30 formed in layers 26-28, and plasma etch access holes 32 in flap 30. The portion 34 of hinge layer 26 that is not covered by beam layer 28 forms a hinge attaching flap 30 to the portion of layers 26-28 supported by spacer 24. Also, buried etch stop remnants 36 are clearly visible in FIG. 1b and will be described in the following although they have no operational function. Indeed, if remnants 36 were removed during processing, then little operational difference would be noticed. Typical dimensions for pixel 20 would be as follows: flap 30 is a square with sides 12 microns long, spacer 24 is 4 microns thick (vertieal in FIG. 1b), hinge layer is 800 Å thick, beam layer is 3,600 Å thick, holes 32 are two microns square, plasma etch access gap 38 (the space between flap 30 and the remainder of beam layer 28) is two microns wide, hinge 34 is three microns long and two microns wide, and remnants 36 are 1,500 Å thick and about 1.5 microns long.

Figure 4A:
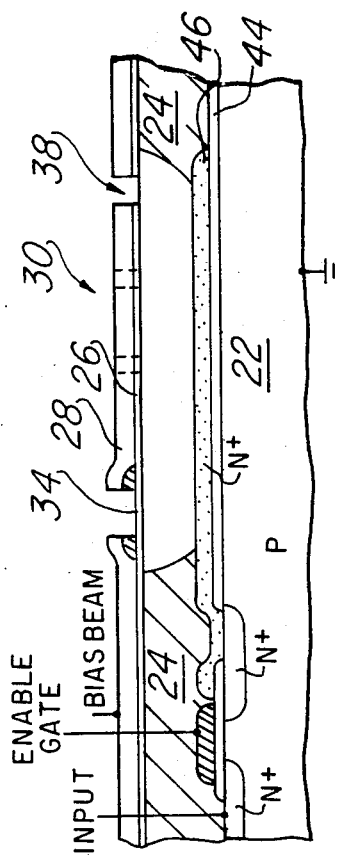
FIGS. 4a and 4b illustrate in cross sectional and plan views a second preferred embodiment pixel.

Substrate 22 is (100) silicon with resistivity about 10 ohm-cm and typically will have addressing circuitry formed on its surface, although such circuitry has been omitted from FIGS. 1a-1c for clarity; see FIG. 4a for a cross sectional elevation view illustrating a portion of such circuitry. Thus in FIGS. 1a-1c substrate 22 should be considered to be a conductor. Spacer 24 is positive photoresist which is an insulator; hinge layer 26 and beam layer 28 are both an aluminum, titanium, and silicon alloy (Ti:Si:Al) with 0.2% Ti and 1% Si (this alloy has a coefficient of thermal expansion not drastically different from spacer 24 and thus minimizes the stress between the metal layers and spacer 24 generated during the fabrication process described in the following, also, the two layers 26 and 28 being the same metal minimizes stress): and remnants 36 are silicon dioxide. Note that any stress between layers in the flap or hinge would cause warping or curling of the flap or hinge, and any stress between the metal and the spacer can cause buckling or warping of the free portion of the metal over the well.

The architecture of FIGS. 1a–1c simultaneously satisfies two criteria: (1) it is possible to make the beam metal as thick and the hinge metal as thin as desired without the problems of step coverage of the hinge metal over the beam metal and (2) the spacer surface under the beam metal is not exposed to processing side effects which would arise if the hinge were formed as a rectangular piece on the spacer prior to deposition of the beam metal.

Figure 2:
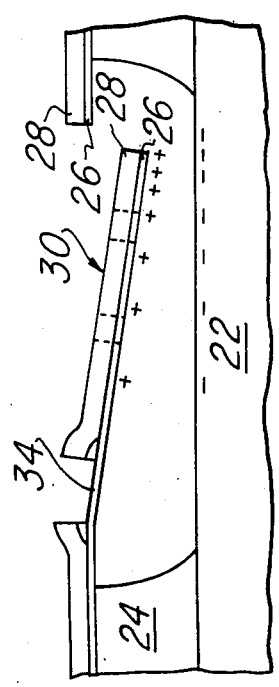
FIG. 2 illustrates delfection of the pixel beam.

Pixel 20 is operated by applying a voltage between metal layers 26–28 and substrate 22 (actually an electrode on substrate 22 as described in the following); flap 30 and the exposed surface of substrate 22 form the two plates of an air gap capacitor and the opposite charges induced on the two plates by the applied voltage exert electrostatic force attracting flap 30 to substrate 22. This attractive force causes flap 30 to bend at hinge 34 and be deflected towards substrate 22; see FIG. 2 for an exaggerated view of this deflection together with an indication of the charges concentrated at the regions of smallest gap. For voltages in the range of 20 to 30 volts, the deflection is in the range of 2 degrees. Of course, if hinge 34 were made longer or thinner or narrower, the deflection would increase as the compliance of hinge 34 varies linearly with the inverse of its width and directly with the square of its length and inversely with the cube of its thickness. Note that the thickness of flap 30 prevents significant warping of flap 30 due to surface stress generated during processing, but that the thinness of hinge 34 allows for large compliance.

Figure 3:
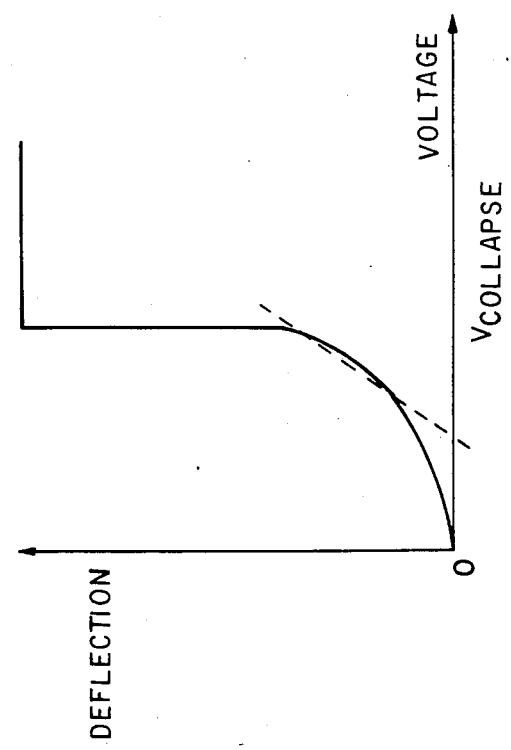
FIG. 3 shows the dependence of beam deflection on applied voltage.

The deflection of flap 30 is a highly nonlinear function of the applied voltage because the restoring force generated by the bending of hinge 34 is approximately a linear function of the deflection but the electrostatic force of attraction increases as the logarithm of the reciprocal of the distance between the closest corner of flap 30 and substrate 22 (recall that the capacitance increases as the distance decreases so the induced charges both increase in quantity and get closer together). FIG. 3 illustrates the dependence of deflection on voltage; the voltage at which flap 30 becomes unstable and bends all the way to touch substrate 22 is called the collapse voltage. For voltages somewhat less than the collapse voltage the deflection is approximately a linear function of the voltage (see the dotted line in FIG. 3) and this is the analog operating region.

Figure 4B:
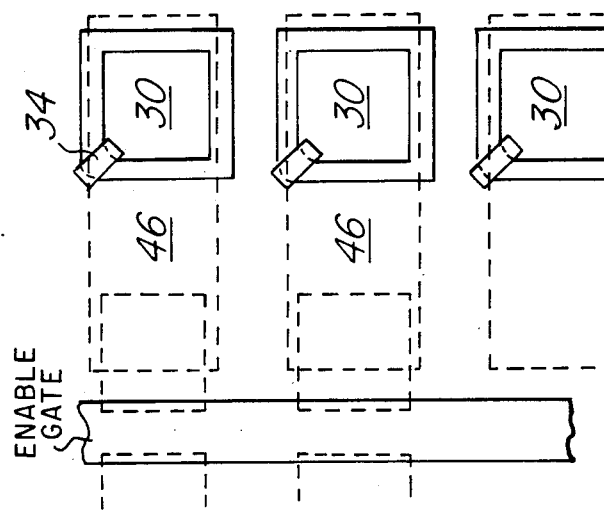

The addressing of individual pixels arranged in a linear DMD is illustrated in FIGS. 4a and 4b: FIG. 4a is a cross sectional view of a single pixel showing input and enable gate plus a beam bias and FIG. 4B is a plan view showing the pixels and addressing circuitry. Ti:Si:Al electrode 46 is insulated from substrate 22 by silicon dioxide 44, and the voltage to deflect flap 30 is applied to electrode 46 with metal layers 26–28 a common bias for all pixels and substrate 22 grounded. The common bias on beam 30 permits smaller signals to be used by moving the zero input along the x axis in FIG. 3.

The steps of first preferred embodiment method of fabrication of pixel 20, including addressing electrode 46 on substrate 22, are illustrated in cross sectional elevation view in FIGS. 5a–5e as follows.

(a) First, 2,000 Å of thermal oxide 44 is grown on (100) silicon substrate 22. Next, 3,000 Å of Ti:Si:Al (0.2% Ti and 1% Si) is sputter deposited on oxide 44, and patterned and plasma etched to define electrodes 46.

(b) Positive photoresist is spun on and baked in three applications to a total thickness of four microns to form spacer 24: three applications of resist are used to build up the thickness in order to avoid resist surface waves which can occur when spinning on a single very thick layer. A bake of approximately 180° C. is required after each application of resist to prevent the previous layers from dissolving in the resist solvent and to drive out excess solvent from the spacer; the last bake avoids the formation of solvent bubbles under the hinge metal during the photoresist bake for the beam pattern photolithography. Note that the photoresist planarizes over any circuitry that has been formed on the surface of substrate 22. The positive photoresist is preferably chosen to be insoluble in chlorobenzene, for example, novalac based resists. Then 800 Å of Ti:Si:Al (0.2% Ti and 1% Si) to form hinge layer 26 is sputter deposited at a substrate temperature as near to room tempertaure as possible to minimize thermal expansion mismatch between organic spacer 24 and metal layer 26. Also, this alloy of aluminum minimizes the hillocking arising in deposition of pure aluminum. Next, 1,500 Å of silicon dioxide is deposited by PEVCD; the oxide is then patterned and etched to form hinge etch stop 48 (in plan view etch stop 48 occupies the regions 34 and 36 in FIG. 1C) and the photoresist used in the patterning and etching is plasma stripped.

(c) 3,600 Å of Ti:Si:Al (0.2% Ti and 1% Si) to form beam layer 28 is sputter deposited, again near room temperature, and photoresist 50 is spun on. The deposition of the metal is under the same conditions as for the deposition of hinge layer 26 so that no stresses between the metal layers are developed. Photoresist 50 is patterned to define plasma etch access holes 32 and plasma etch access gap 38 plus hinge 34 (in FIG. 1C plan view photoresist 50 has the annular region consisting of regions 38 and 34 plus the holes 32 removed). Patterned photoresist 50 is then used as the mask for plasma etching the metal layers 26 and 28 with hinge etch stop 48 preventing the etching of the portion of hinge layer 26 that becomes hinge 34. The plasma etch of the aluminum alloy may be with a chlorine/boron trichloride/carbon tetrachloride etch gas mixture. Note that the hinge thickness is determined by the thickness of layer 26, the hinge width is determined by the width of etch stop 48, and the hinge length is determined by the width of plasma etch access gap 38; thus the compliance of hinge 34 may be adjusted by three different process parameters. Note that with a given resolution in the patterning processes the hinge dimensions are more easily controlled by use of etch stop 48 than by use of the one layer beam of applicant's copending applications previously referenced.

(d) One and a half microns of PMMA (polymethyl methacrylate) 52 is spun on as a protective layer during subsequent steps, and substrate 22 is diced into chips (each chip to become a DMD). The dicing debris is illustrated sitting on PMMA 52.

Figure 6A:
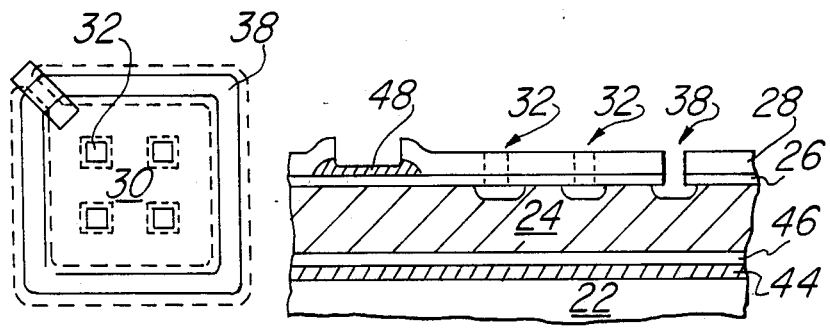
FIGS. 6a-6c further illustrate the last step of the method of fabrication.
Figure 6B:
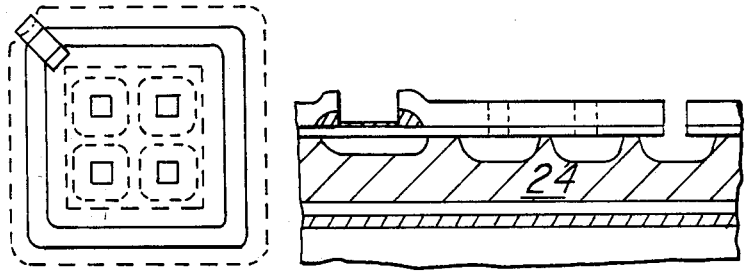
Figure 6C:
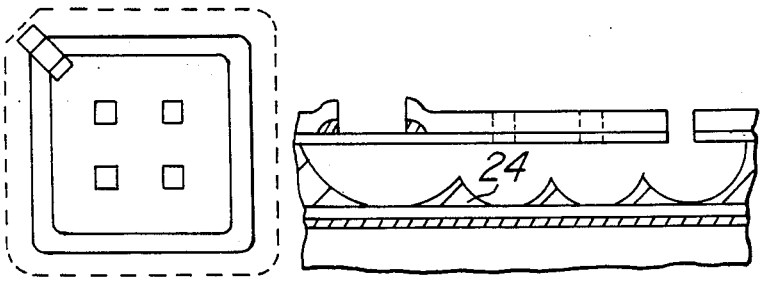

(e) PMMA 52 is dissolved by spraying with chlorobenzene and immediately centrifuging; note that resist 50 and spacer 24 do not dissolve in chlorobenzene. Thus the dicing debris is removed without flap 309 being directly exposed to the debris. Lastly, spacer 24 and resist 50 are isotropically plasma etched in oxygen, with a few percent fluorine (such as from $CF_4$ or $NF_3$) to remove the exposed portion of etch stop 48; this etching is at low temperature and monitored to remove just enough of spacer 24 to form the well below flap 30. FIGS. 6a–6c illustrate in plan and cross sectional view the stages of the etch of spacer 24.

Figure 7:
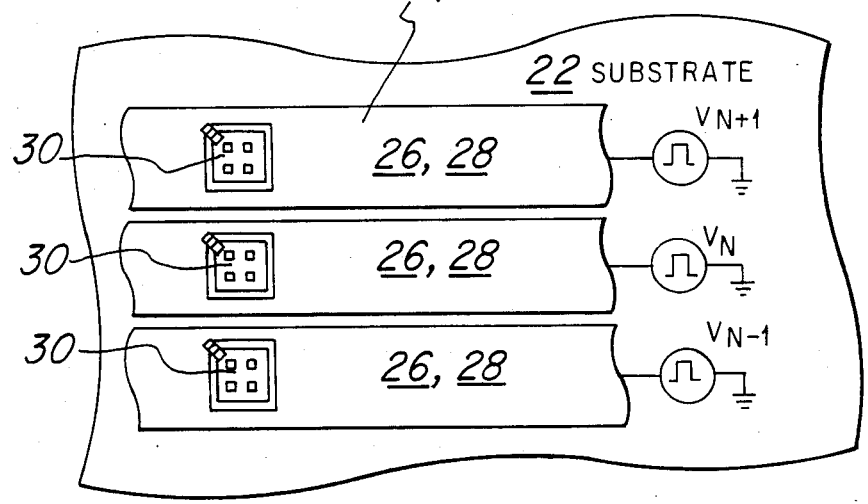
FIG. 7 shows alternative addressing.

An alternative to the addressing by electrodes 46 with the beams at a common bias is to pattern the metal layers 26 and 28 so that addressing is through the beam and substrate 22 is a common ground (electrodes 46 and insulator 44 would be omitted in this embodiment); see FIG. 7 for a plan view of such patterning of the metal layers.

FIGS. 8a and 8b illustrate in cross sectional and plan views third preferred embodiment pixel, generally denoted 120, includes two hinges 134 so that flap 130 is torsionally mounted and electrode 146 only attracts one half of flap 130 to provide the torque to twist flap 130 in the directions shown by arrows 150. That is, FIG. 8a is a view along the axis of twist.

MODIFICATIONS AND ADVANTAGES

Various modifications of the preferred embodiment devices and methods may be made while retaining the thin hinge plus thick beam feature. For example, the dimensions and shapes can be varied such as the hinge length, width, and thickness, the size of the beams and their thickness, the thickness of the spacer, and so forth. Even the geometry of the beams and hinges can be varied as shown in FIGS. 9a–9e. In fact, patterns of thick and thin portions could be fabricated in the beams, and three or more layers of metal with etch stops in each layer could yield bizarre beam structures. Also, the materials can be varied such as Cu:Al for the metal, differing resists for the spacer, radiation hardening of the spacer, other semiconductors for the substrate and the electrodes or metal electrodes, and so forth. The etch stop could be a different material, such as tungsten; and processing could result in no etch stop remnants between the hinge metal and the beam metal.

The advantages of the thin hinge plus thick beam include the ease of adjustment of pixel sensitivity by modifying the hinge dimensions together with the resistance to warping of a thick flap. Also, for a given resolution in the patterning processes the hinge dimensions are easily controlled.

What is claimed is:

1. A spatial light modulator, comprising:
 (a) a plurality of pixels formed in a layered structure:
 (b) said layered structure including a substrate, s spacer layer on said substrate, a first reflecting layer on said spacer, a second reflecting layer on said first layer, and electrical addressing circuitry:
 (c) for each of said pixels including
  i. an electrostatically deflectable element formed in said reflecting layers and connected to the remainder of said reflecting layers by a hinge formed in said first layer alone, and
  ii. a well formed in said spacer and located between said deflectable element and said substrate.

2. The modulator of claim 1, wherein:
 (a) said spacer is planarizing spun on material.
3. The modulator of claim 1, wherein:
 (a) said deflectable elements of said pixels are electrically interconnected: and
 (b) said addressing circuitry includes for each pixel an electrode on said substrate at the bottom of said well.
4. The modulator of claim 3, wherein:
 (a) said electrode is formed of an aluminum alloy.
5. The modulator of claim 1, wherein:
 (a) said first and second reflecting layers are the same material.
6. The modulator of claim 5, wherein:
 (a) said material is an alloy of aluminum.
7. The modulator of claim 1, wherein:
 (a) said second reflecting layer is much thicker than said first layer.
8. The modulator of claim 1, wherein:
 (a) said deflectable element contains at least one hole through which plasma etching to form said well may partially proceed.
9. A spatial light modulator, comprising:
 (a) a plurality of pixels formed in a layered structure:
 (b) said layered structure including a substrate, a spacer layer on said substrate, a first conducting reflecting layer on said spacer, a second conducting reflecting layer on said first layer, and electrical addressing circuitry;
 (c) each of said pixels including
  i. an electrostatically deflectable element formed in said reflecting layers and connected to the remainder of said reflecting layers by a hinge formed in said first layer alone, and
  ii. a well formed in said spacer and located between said deflectable element and said substrate; and
 (d) said addressing circuitry including for each of said pixels an electrode on and insulated from said substrate at the bottom of said well.
10. A spatial light modulator, comprising:
 (a) a plurality of pixels formed in a layered structure:
 (b) said layered structure including a substrate, a spacer layer on said substrate, a first reflecting layer on said spacer, a second reflecting layer on said first layer, and electrical addressing circuitry:
 (c) each of said pixels including
  i. an electrostatically deflectable element formed in said reflecting layers and connected to the remainder of said reflecting layers by two hinges formed in said first layer alone, and
  ii. a well formed in said spacer and located between said deflectable element and said substrate; and
 (d) said addressing circuitry includes an electrode at the bottom of said well but asymmetrically disposed with respect to the axis running through said two hinges.
11. The modulator of claim 10, wherein:
 (a) said spacer is planarizing spun on material.
12. The modulator of claim 10, wherein:
 (a) said reflecting layers are both alloys of aluminum.
13. The modulator of claim 11, wherein:
 (a) said second reflecting layer is much thicker than said first reflecting layer.
14. A spatial light modulator, comprising:
 (a) a plurality of pixels formed in a layered structure:
 (b) said layered structure including a substrate, s spacer layer on said substrate, a thin conducting reflecting layer on said spacer, a thick conducting reflecting layer on said thin layer, and electrical addressing circuitry;
(c) each of said pixels including
  i. an electrostatically deflectable element formed in said reflecting layers and connected to the remainder of said reflecting layers by a hinge formed in said thin layer alone, and
  ii. a well formed in said spacer and located between said deflectable element and said substrate.

15. The modulator of claim 14, wherein:
(a) said well is of curvature characterized by plasma etch formation.

16. The modulator of claim 15, wherein:
(a) said reflecting layers are alloys of aluminum; and
(b) said spacer is a planarizing spun on material.

17. A method of fabricating a deflectable beam spatial light modulator, comprising the steps of:
(a) forming addressing circuitry on a semiconductor substrate:
(b) forming a planarizing spacer over said circuitry and substrate:
(c) depositing a thin layer of a reflecting material on said spacer:
(d) forming a plurality of etch stops on said thin layer, at least one etch stop for each of said deflectable beams;
(e) depositing a thick layer of said material over said etch stops and said thin layer:
(f) patterning said thick layer to define said deflectable beams and etching said thick and thin layers with said pattern, said etch stops preventing etching of said thin layer only and defining hinges for support of said deflectable beams; and
(g) etching at least the exposed portion of said etch stops and the portion of said spacer immediately between said deflectable beams and said addressing circuitry and substrate.

18. The method of claim 17, wherein:
(a) said material is an aluminum alloy, said spacer is baked photoresist, said etch stops are silicon dioxide, and said substrate is silicon.

* * * * *